(12) United States Patent
Lee (10) Patent No.: US 9,082,998 B2
(45) Date of Patent: Jul. 14, 2015

(54) ORGANIC ELECTROLUMINESCENT DISPLAY MODULE

(75) Inventor: Hyun Lee, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 1082 days.

(21) Appl. No.: 12/882,859

(22) Filed: Sep. 15, 2010

(65) Prior Publication Data

US 2011/0063263 A1 Mar. 17, 2011

(30) Foreign Application Priority Data

Sep. 17, 2009 (KR) ...................... 10-2009-0088200

(51) Int. Cl.
*G09G 5/00* (2006.01)
*H05K 5/00* (2006.01)
*H01L 51/52* (2006.01)
*H01L 27/32* (2006.01)

(52) U.S. Cl.
CPC ........ *H01L 51/5243* (2013.01); *H01L 27/3244* (2013.01); *H01L 51/5237* (2013.01); *H01L 51/529* (2013.01); *H01L 51/5281* (2013.01)

(58) Field of Classification Search
CPC .................................. G09G 5/00; H05K 5/00
USPC ...................... 345/73–84, 204–215, 690–699; 361/679.01, 679.021
See application file for complete search history.

(56) References Cited

U.S. PATENT DOCUMENTS

| | | | | |
|---|---|---|---|---|
| 7,173,377 B2 * | 2/2007 | Park et al. | ................... | 315/169.1 |
| 7,511,435 B2 * | 3/2009 | Ye et al. | ......................... | 315/291 |
| 7,710,412 B2 * | 5/2010 | Adachi et al. | ................. | 345/206 |
| 7,924,388 B2 * | 4/2011 | Abe | .............................. | 349/150 |
| 8,044,586 B2 * | 10/2011 | Wang et al. | .................... | 313/512 |
| 2006/0145605 A1 * | 7/2006 | Park | .............................. | 313/506 |
| 2007/0039280 A1 | 2/2007 | Liu et al. | | |
| 2007/0285007 A1 * | 12/2007 | Lee et al. | ...................... | 313/504 |
| 2008/0030940 A1 * | 2/2008 | Park et al. | ..................... | 361/681 |
| 2009/0251050 A1 * | 10/2009 | Seo | ............................... | 313/504 |
| 2010/0259563 A1 * | 10/2010 | Tokuda et al. | ................ | 345/690 |

FOREIGN PATENT DOCUMENTS

| | | |
|---|---|---|
| CN | 101150139 | 3/2008 |
| KR | 10-2004-0010987 | 2/2004 |
| KR | 10-0857689 | 9/2008 |
| KR | 10-0903625 | 6/2009 |

\* cited by examiner

*Primary Examiner* — Kent Chang
*Assistant Examiner* — Scott Au
(74) *Attorney, Agent, or Firm* — McKenna Long & Aldridge LLP (57) ABSTRACT

An organic electroluminescent display module includes: an organic electroluminescent display panel including a front surface, a side surface and a rear surface, the front surface displaying images; and a bottom frame surrounding the side and rear surfaces partially, the bottom frame including a metallic material.

16 Claims, 7 Drawing Sheets

ORGANIC ELECTROLUMINESCENT
DISPLAY MODULE

The present application claims the benefit of Korean Patent Application No. 10-2009-0088200 filed in Korea on Sep. 17, 2009, which is hereby incorporated by reference in its entirety.

BACKGROUND OF THE INVENTION

1. Field of the Invention

The present invention relates to an organic electroluminescent display (ELD) module, and more particularly, to an organic electroluminescent display module where stiffness is improved.

2. Discussion of the Related Art

As information technology progresses, flat panel display (FPD) devices having light weight, thin profile and low power consumption have been developed. Specifically, cathode ray tubes (CRTs) have been replaced by FPD devices such as a plasma display panel (PDP) device, a liquid crystal display (LCD) device or an organic electroluminescent display (ELD) device.

Among flat panel displays (FPDs), organic ELD devices have been of particular interest in research and development because they have high brightness and low driving voltage. Since organic ELD devices are an emissive type, a backlight unit is not required to organic ELD devices. Accordingly, organic ELD devices have light weight and thin profile.

Organic ELD devices may be classified into a passive matrix type and an active matrix type according to existence of a switching element. In a passive matrix type organic ELD device, a scan line and a signal line crossing each other to define a pixel region are disposed in a matrix without a switching element. In an active matrix type organic ELD device, a scan line and a signal line crossing each other to define a pixel region are disposed in a matrix and a thin film transistor (TFT) as a switching element and a storage capacitor are disposed in each pixel region.

Since the passive matrix type organic ELD device has disadvantages in resolution, power consumption and lifetime, the active matrix type organic ELD device having advantages of high resolution and large size has been the subject of recent research and development.

Figure 1:
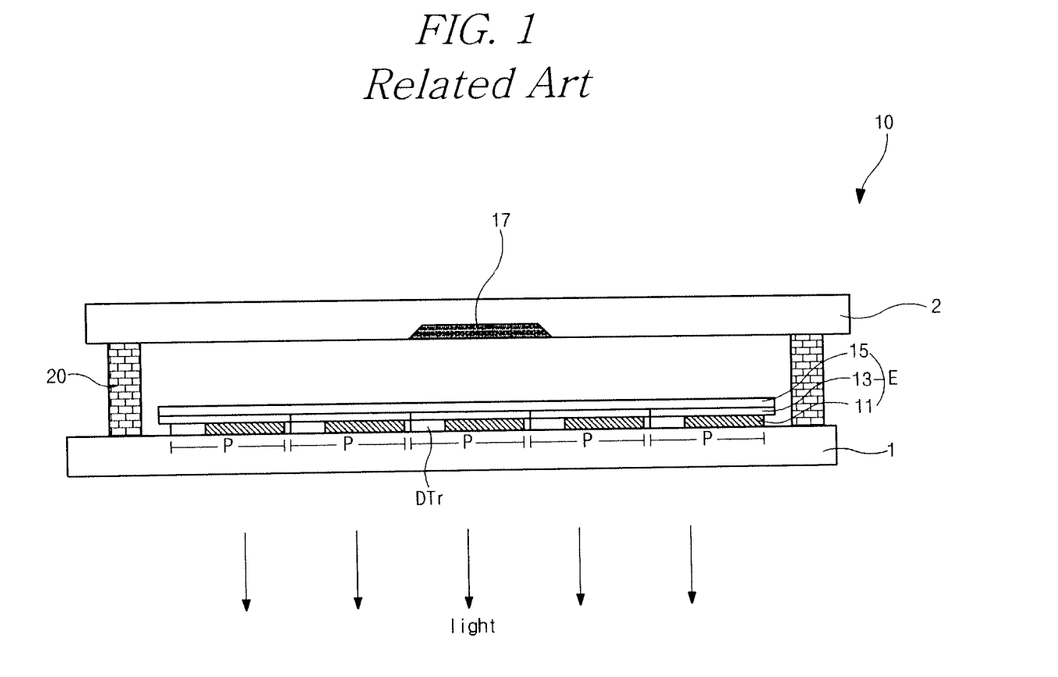
FIG. 1 is a cross-sectional view showing an active matrix type organic electroluminescent display panel according to the related art.

FIG. 1 is a cross-sectional view showing an active matrix type organic electroluminescent display panel according to the related art. In FIG. 1, an organic electroluminescent display (ELD) panel 10 of a bottom emission type includes first and second substrates 1 and 2 facing and spaced apart from each other, and the first and second substrates 1 and 2 are attached to each other with a seal pattern 20 at an edge portion of the first and second substrates 1 and 2. A driving thin film transistor (TFT) DTr is formed on the first substrate 1 in each pixel region P. In addition, a first electrode 11, an organic luminescent layer 13 and a second electrode 15 constituting an organic electroluminescent (EL) diode E are sequentially formed on the first substrate. The first electrode 11 is electrically connected to the driving TFT DTr. When the organic ELD panel 10 has a bottom emission type, the first electrode 11 may be formed of a transparent conductive material and the second electrode 15 may be formed of an opaque conductive material so that light from the organic luminescent layer 13 can be emitted through the first electrode 11. An absorbent material 17 is formed in an inner surface of the second substrate 2 to eliminate moisture penetrated from exterior.

The organic ELD device has advantages in viewing angle, contrast ratio and power consumption as compared with the LCD device. In addition, the organic ELD device may be driven with a low DC voltage and have high response speed and wide range in operation temperature. Specifically, since the organic ELD device includes a smaller number of elements as compared with the LCD device, the organic ELD device has light weight and thin profile and low fabrication cost due to simple fabrication process. However, the organic ELD device has a low stiffness due to the smaller number of elements.

SUMMARY OF THE INVENTION

Accordingly, the present invention is directed to an organic electroluminescent display device that substantially obviates one or more of the problems due to limitations and disadvantages of the related art.

An object of the present invention is to provide an organic electroluminescent display device where stiffness is improved.

Another object of the present invention is to provide an organic electroluminescent display device where reliability and display quality are improved.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display module includes: an organic electroluminescent display panel including a front surface, a side surface and a rear surface, the front surface displaying images; and a bottom frame surrounding the side and rear surfaces partially, the bottom frame including a metallic material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the preferred embodiments, examples of which are illustrated in the accompanying drawings.

Figure 2:
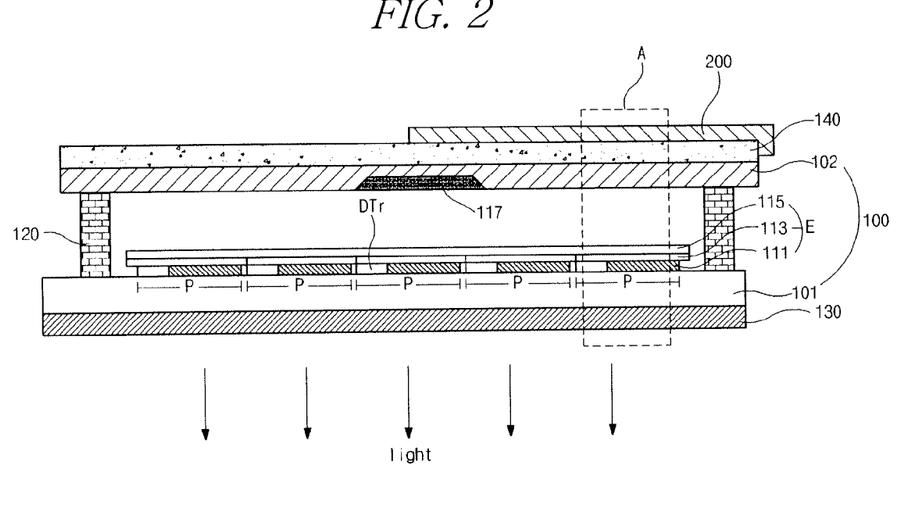
FIG. 2 is a cross-sectional view showing an organic electroluminescent display module according to an embodiment of the present invention.
Figure 3:
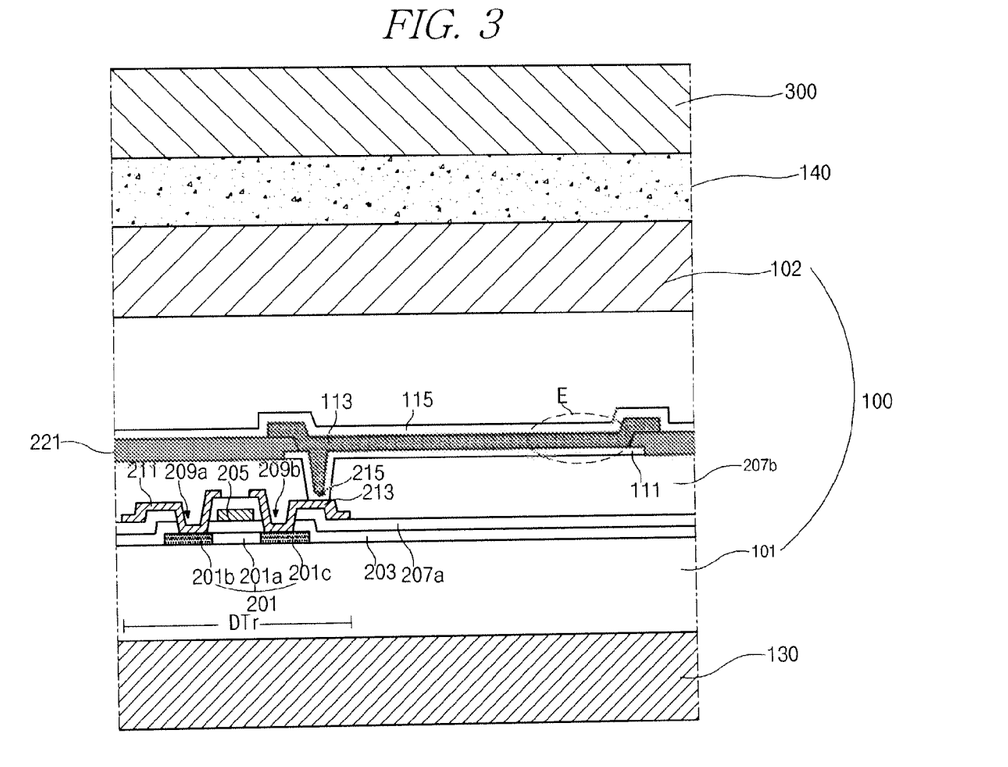
FIG. 3 is a magnified view of a portion A of FIG. 2.

FIG. 2 is a cross-sectional view showing an organic electroluminescent display module according to an embodiment of the present invention, and FIG. 3 is a magnified view of a portion A of FIG. 2.

In FIGS. 2 and 3, an organic electroluminescent display (ELD) module includes an organic ELD panel 100, a polarizing plate 130, a radiating sheet 140 and a bottom frame 300. The organic ELD panel 100 includes first and second substrates 101 and 102 facing and spaced apart from each other, and the first and second substrates 101 and 102 are attached to each other with a seal pattern 120 at an edge portion of the first and second substrates 101 and 102. A switching thin film transistor (TFT) (not shown), a driving TFT DTr and an organic electroluminescent (EL) diode E are formed on an inner surface of the first substrate 101, and an absorbent material 117 is formed in an inner surface of the second substrate 102 to eliminate moisture penetrated from exterior. The second substrate 102 is used for encapsulating the organic EL diode E of the first substrate 101.

A semiconductor layer 201 is formed on the first substrate 101, and a gate insulating layer 203 is formed on the semiconductor layer 201. The semiconductor layer 201 includes an active region 201a of intrinsic silicon and source and drain regions 201b and 201c of impurity-doped silicon. The active region 201a is used as a channel region and the source and drain regions 201b and 201c are disposed at both sides of the active region 201a. A gate electrode 205 and a gate line (not shown) connected to the gate electrode 205 are formed on the gate insulating layer 203. In addition, a first interlayer insulating layer 207a is formed on the gate electrode 205 and the gate line. The first interlayer insulating layer 207a and the gate insulating layer 203 include first and second semiconductor contact holes 209a and 209b exposing the source and drain regions 201b and 201c, respectively.

Source and drain electrodes 211 and 213 are formed on the first interlayer insulating layer 207a. The source electrode 211 is connected to the source region 201b through the first semiconductor contact hole 209a, and the drain electrode 213 is connected to the drain region 201c through the second semiconductor contact hole 209b. The semiconductor layer 201, the gate insulating layer 203, the gate electrode 205, the source electrode 211 and the drain electrode 213 constitute the driving TFT DTr. Moreover, a data line (not shown) is formed on the first interlayer insulating layer 207a. The data line crosses the gate line to define a pixel region P. The switching TFT may have the same structure as the driving TFT DTr and is connected to the data line and the driving TFT DTr. Although each of the switching TFT and the driving TFT DTr has a top gate type where a gate electrode is formed over a semiconductor layer in FIGS. 2 and 3, each of the switching TFT and the driving TFT DTr may have a bottom gate type where a semiconductor layer is formed over a gate electrode in another embodiment.

Further, a second interlayer insulating layer 207b is formed on the source and drain electrodes 211 and 213. A first electrode 111, an organic luminescent layer 113 and a second electrode 115 are sequentially formed on the second interlayer insulating layer 207b. The first electrode 111, the organic luminescent layer 113 and the second electrode 115 constitute the organic EL diode E. The first electrode 111 is connected to the drain electrode 213 of the driving TFT DTr. When the organic ELD panel 100 has a bottom emission type, the first electrode 111 may include a transparent conductive material such as indium-tin-oxide (ITO) and indium-zinc-oxide (IZO) having a relatively high work function, and the second electrode 115 may include a metallic material such as aluminum (Al) and aluminum alloy (e.g., aluminum neodymium (AlNd)) having a relatively low work function. As a result, the first and second electrodes 111 and 115 function as a cathode and an anode, respectively, and the light from the organic luminescent layer 113 is emitted through the first electrode 111. In addition, a bank 221 is formed at a boundary portion of each pixel region P and on the second interlayer insulating layer 207b. For example, the bank 221 may have a matrix shape exposing each pixel region P and the organic luminescent layer 113 may be formed on the bank 221 and the first electrode 111.

The organic luminescent layer 113 may have a single layer or a multiple layer including a hole injecting layer (HIL), a hole transporting layer (HTL), an emitting material layer (EML), an electron transporting layer (ETL) and an electron injecting layer (EIL) for improving emission efficiency.

In the organic ELD panel 100, when a voltage of a data signal is applied to the first and second electrodes 111 and 115, the holes injected from the first electrode 111 and the electrons injected from the second electrode 113 are transported to the organic luminescent layer 113, and excitons are generated by the holes and the electrons in the organic luminescent layer 113. In addition, the light is generated in the organic luminescent layer 113 by the transition from an excited state to a ground state of the excitons and is emitted as a visible ray. The light from the organic luminescent layer 113 is emitted through the first electrode 111 so that the organic ELD panel 100 can display images.

The second substrate 102 faces and is spaced apart from the first substrate 101. The first and second substrates 101 and 102 are attached to each other with the seal pattern 120, thereby the organic EL diode E encapsulated. For example, the seal pattern 120 may be formed of a heat curable resin or an ultraviolet (UV) curable resin.

The first substrate 101 may include one of glass and stainless steel. When the organic ELD panel 100 has a bottom emission type, the first substrate is formed of glass. In addition, the second substrate 102 may include a metal foil. When the second substrate 102 is formed of a metal foil, the thickness of the second substrate 102 is reduced as compared with the second substrate of glass, and the organic ELD panel 100 may have a thin profile.

To improve a radiation property of the organic ELD panel 100, the radiating sheet 140 such as a fan or a heat pipe is formed on an outer surface of the second substrate 102 that is not used for displaying images. The organic ELD panel 100 may be heated up to about 80° C. to about 90° C. by a heat from the switching and driving TFTs and the organic EL diode E, and the lifetime of the organic ELD panel 100 is reduced. Since the radiating sheet 140 is attached to the outer surface of the second substrate 102 using an adhesive, the heat of the organic ELD panel 100 is radiated and reduction of lifetime of the organic ELD panel 100 is prevented. Specifically, the radiation effect is further improved by the second substrate 102 of a metal foil. As a result, the heat generated from the organic ELD panel 100 is effectively radiated through the second substrate 102 of a metal foil and the radiating sheet 140 to exterior.

To improve a contrast ratio of the organic ELD panel 100, the polarizing plate 130 may be formed on an outer surface of the first substrate 101. The contrast ratio of the organic ELD panel 100 may be reduced by reflection of an external light through the first substrate 101. Since the polarizing plate 130 shields the reflected light emitted from the first substrate 101, reduction in contrast ratio of the organic ELD panel 100 is prevented. For example, the polarizing plate 130 may be a circular polarizer. When the external light enters the organic ELD panel 100 through the polarizing plate 130, the external light is circularly polarized. The circularly polarized light may pass through the first electrode 111 and the organic luminescent layer 113 and may be reflected at the second electrode 115. The reflected light has a circular polarization direction different from the incident light. As a result, the reflected light is absorbed by the polarizing plate 130, and reduction in contrast ratio of the organic ELD panel 100 due to the external light is prevented by the polarizing plate 130.

Since the organic ELD panel 100 having the radiating sheet 140 and the polarizing plate 130 is surrounded and modularized by the bottom frame 300 of a metallic material, the stiffness of the organic ELD panel 100 is improved. As a result, the resistance to the physical impact of the organic ELD module including the organic ELD panel 100, the polarizing plate 130 and the radiating sheet 140 is improved.

Figure 4:
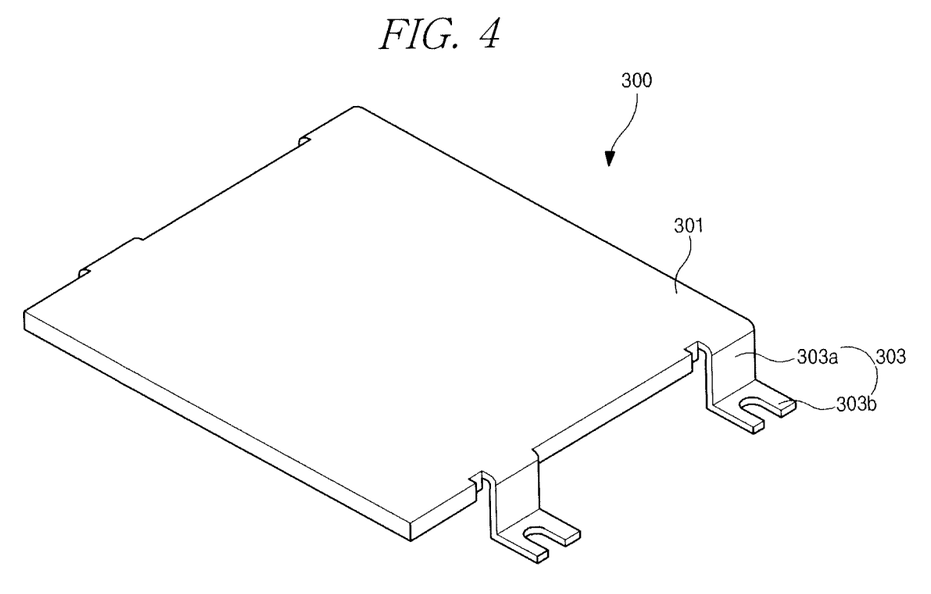
FIG. 4 is a perspective view showing a bottom frame for an organic electroluminescent display module according to an embodiment of the present invention.

FIG. 4 is a perspective view showing a bottom frame for an organic electroluminescent display module according to an embodiment of the present invention.

In FIG. 4, a bottom frame 300 for an organic electroluminescent display (ELD) panel 100 (of FIG. 3) has a horizontal surface 301 and a plurality of fixing portions 303. The bottom frame 300 may include a metallic material such as aluminum (Al). In addition, the bottom frame 300 surrounds and supports the organic ELD panel 100 to improve stiffness of the organic ELD panel 100. The horizontal surface 301 has a rectangular plate shape. The organic ELD panel 100 is disposed on the horizontal surface 301 of the bottom frame 300. The plurality of fixing portions 303 are perpendicularly bent from opposite side edges of the horizontal surface 301, and surround side portions of the organic ELD panel 100 on the horizontal surface 301. In addition, the plurality of fixing portions 303 combines the organic ELD panel 100 and the radiating sheet 140 (of FIG. 3) and protects the side portions of the organic ELD panel 100. For example, the plurality of fixing portions 303 may include at least two fixing portions at each side edge of the horizontal surface 301.

Each of the plurality of fixing portions 303 includes a first portion 303a perpendicularly bent from the horizontal surface 301 and a second portion 303b perpendicularly outwardly bent from the first portion 303a. Accordingly, the organic ELD panel 100 and the radiating sheet 140 are supported by the horizontal surface 301. In addition, the organic ELD panel 100 and the radiating sheet 140 are assembled and protected by the first portions 303a of the plurality of fixing portions 303. The bottom frame 300 modularizing the organic ELD panel 100 and the radiating sheet 140 may be combined with an external case (not shown) surrounding front portions of the organic ELD panel 100. The second portion 303b has a through hole for combining the bottom frame 300 and the external case. For example, the second portion 303b may have a fork shape and a fixing means such as a screw may be combined to a fixing hole of the external case through the through hole of the second portion 303b of the bottom frame 300 with the organic ELD panel 100 and the radiating sheet 140 interposed between the top and bottom frames. Since the bottom frame 300 of a metallic material surrounds a portion of a rear surface, i.e., the outer surface of the second substrate 102 (of FIG. 3) and a portion of a side surface of the organic ELD panel 100 having the radiating sheet 140, the stiffness of the organic ELD module is improved. For example, the organic ELD module according to the present invention may have stiffness similar to an LCD module including a backlight unit.

Moreover, since the second substrate 102 of the organic ELD panel 100 is formed of a metal foil, the organic ELD module has flexibility. Accordingly, the organic ELD module absorbs a physical impact due to the flexibility and stiffness is further improved. A pressure test for inspecting durability of a display module will be illustrated hereinafter.

Figure 5:
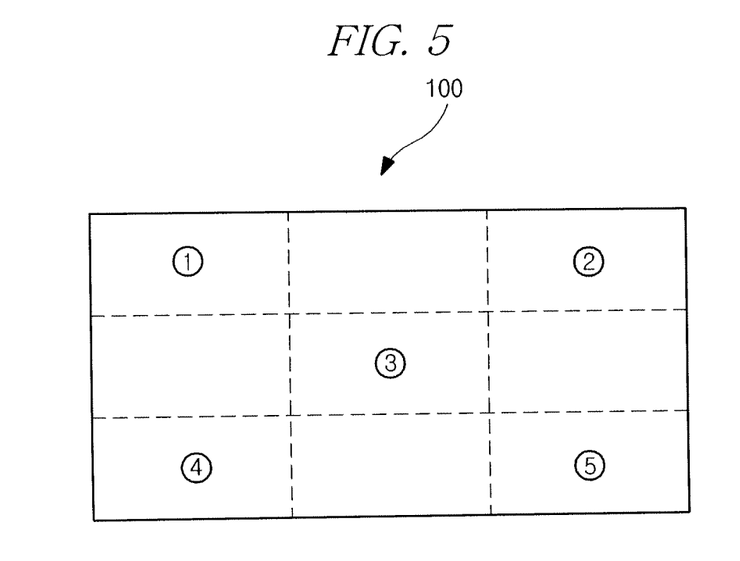
FIG. 5 is a plan view showing sections for a pressure test on an organic electroluminescent display module according to an embodiment of the present invention.

FIG. 5 is a plan view showing sections for a pressure test on an organic electroluminescent display module according to an embodiment of the present invention.

In FIG. 5, an organic electroluminescent display (ELD) panel 100 of an organic ELD module is divided into nine sections, and test pressures are added to the five sections □ to □, which correspond to a central portion and four corner portions of the organic ELD panel 100, respectively. For example, after the organic ELD module is horizontally disposed at a height of about 10 mm from a stage, the test pressures of 1 kgf, 2 kgf, 3 kgf, 4 kgf and 5 kgf may be sequentially added to linearly arranged five points of each of the five sections □ to □ of the organic ELD panel 100 from above, and it may be inspected whether the organic ELD module is damaged or not. The organic ELD module having no breakdown is transferred to a subsequent process, while the broken organic ELD module is discarded.

TABLE 1 illustrates results of a pressure test for organic electroluminescent display modules according to an embodiment of the present invention.

TABLE 1

| | results | | | | |
|---|---|---|---|---|---|
| | section □ | section □ | section □ | section □ | section □ |
| sample 1 | ○ | ○ | ○ | ○ | ○ |
| sample 2 | ○ | ○ | ○ | ○ | ○ |
| sample 3 | ○ | ○ | ○ | ○ | ○ |
| sample 4 | ○ | ○ | ○ | ○ | ○ |
| sample 5 | ○ | ○ | ○ | ○ | ○ |
| sample 6 | ○ | ○ | ○ | ○ | ○ |

○: no breakdown

In TABLE 1, a pressure test is performed for six organic ELD modules. Five test pressures of 1 kgf, 2 kgf, 3 kgf, 4 kgf and 5 kgf are sequentially added to five points, respectively, of each of five sections □ to □ of six organic ELD modules (sample 1 to sample 6), and it is inspected that each of the six organic ELD modules have no breakdown. Accordingly, the organic ELD module where the bottom frame 300 (of FIG. 3) surrounds a portion of a rear surface and a portion of a side surface of the organic ELD panel 100 (of FIG. 3) having the radiating sheet 140 (of FIG. 3) has no breakdown in the pressure test and a stiffness of the organic ELD module is improved.

Figure 6:
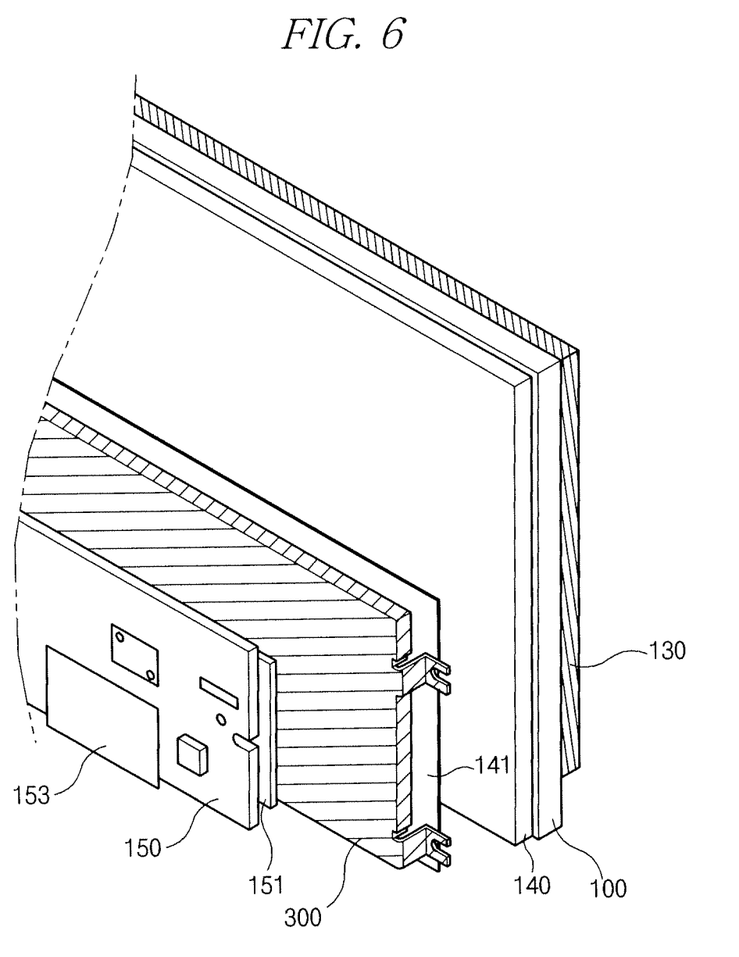
FIG. 6 is an exploded perspective view showing an organic electroluminescent display module according to an embodiment of the present invention.

FIG. 6 is an exploded perspective view showing an organic electroluminescent display module according to an embodiment of the present invention.

In FIG. 6, an organic electroluminescent display (ELD) module includes an organic ELD panel 100, a polarizing plate 130 on a front surface of the organic ELD panel 100, a radiating sheet 140 on a rear surface of the organic ELD panel 100, a bottom frame 300 on the radiating sheet 140 and a printed circuit board (PCB) 150 on the bottom frame 300. The rear and front surfaces of the organic ELD module may be defined according to an emission direction of the organic ELD module. The organic ELD panel 100 includes a first substrate 101 (of FIG. 3) having a switching thin film transistor (TFT), a driving TFT DTr (of FIG. 3) and an organic electroluminescent (EL) diode E (of FIG. 3) and a second substrate 102 (of FIG. 3) of a metal foil. The first and second substrates 101 and 102 facing and spaced apart from each other are attached to each other with a seal pattern 120 (of FIG. 2) at an edge portion of the first and second substrates 101 and 102.

The polarizing plate 130 is attached to the front surface, i.e., an outer surface of the first substrate 101 of the organic ELD panel 100, and the radiating sheet 140 is attached to the rear surface, i.e., an outer surface of the second substrate 102 of the organic ELD panel 100. The contrast ratio of the organic ELD module is improved due to the polarizing plate 130, and the radiation property and the lifetime of the organic ELD module are improved due to the radiating sheet 140.

The bottom frame 300 surrounds and modularizes the organic ELD panel 100, the polarizing plate 130 and the radiating sheet 140. For example, the bottom frame 300 may be attached to the radiating sheet 140 using an adhesive means 141 such as a double-sided tape. The bottom frame 300 includes a horizontal surface 301 (of FIG. 3) and a plurality of fixing portions 303 (of FIG. 3). The horizontal surface 301 is attached to the radiating sheet 140, and each of the plurality of fixing portions 303 includes a first portion 303a perpendicularly bent from the horizontal surface 301 and a second portion 303b perpendicularly outwardly bent from the first portion 303a. In addition, the first portion 303a wraps and fixes side portions of the organic ELD panel 100 and the radiating sheet 140. Since the organic ELD panel 100 and the radiating sheet 140 are modularized by the bottom frame 300 of a metallic material, the stiffness of the organic ELD module is improved to be similar to the stiffness of a liquid crystal display (LCD) module.

The PCB 150 including a plurality of driving circuits for driving the organic ELD panel 100 is disposed over the bottom frame 300. The PCB 150 is electrically connected to the organic ELD panel 100 by a connecting means 153 such as a flexible printed circuit (FPC) and a tape carrier package (TCP). In addition, an insulating film 151 is interposed between the bottom frame 300 and the PCB 150 to prevent an electric interference between the plurality of driving circuits and the bottom frame 300 of a metallic material.

Since the organic ELD panel 100 is modularized by the bottom frame 300, the organic ELD module has stiffness similar to an LCD module together with lighter weight and thinner profile. The LCD module includes a liquid crystal panel, a backlight unit, a top frame, a main frame and a bottom frame. The liquid crystal panel and the backlight unit are modularized by the top frame, the main frame and the bottom frame. In addition, the top frame, the main frame and the bottom frame of a metallic material surround the front the edge surface, the whole side surface and the whole rear surface of the liquid crystal panel and the backlight unit. Since the organic ELD panel 100 is modularized by the bottom frame 300 without the top frame and the main frame, the organic ELD module has lighter weight and thinner profile as compared with the LCD module.

Specifically, since the bottom frame 300 surround the side surface and the rear surface of the organic ELD panel 100 partially, the weight and the thickness of the organic ELD module are further reduced. For example, the bottom frame 300 may be disposed between the organic ELD panel 100 and the PCB 150 to correspond to a lower portion of the organic ELD panel 100. As a result, the side surface and the rear surface corresponding to an upper portion of the organic ELD panel 100 are exposed through the bottom frame 300.

Figure 7:
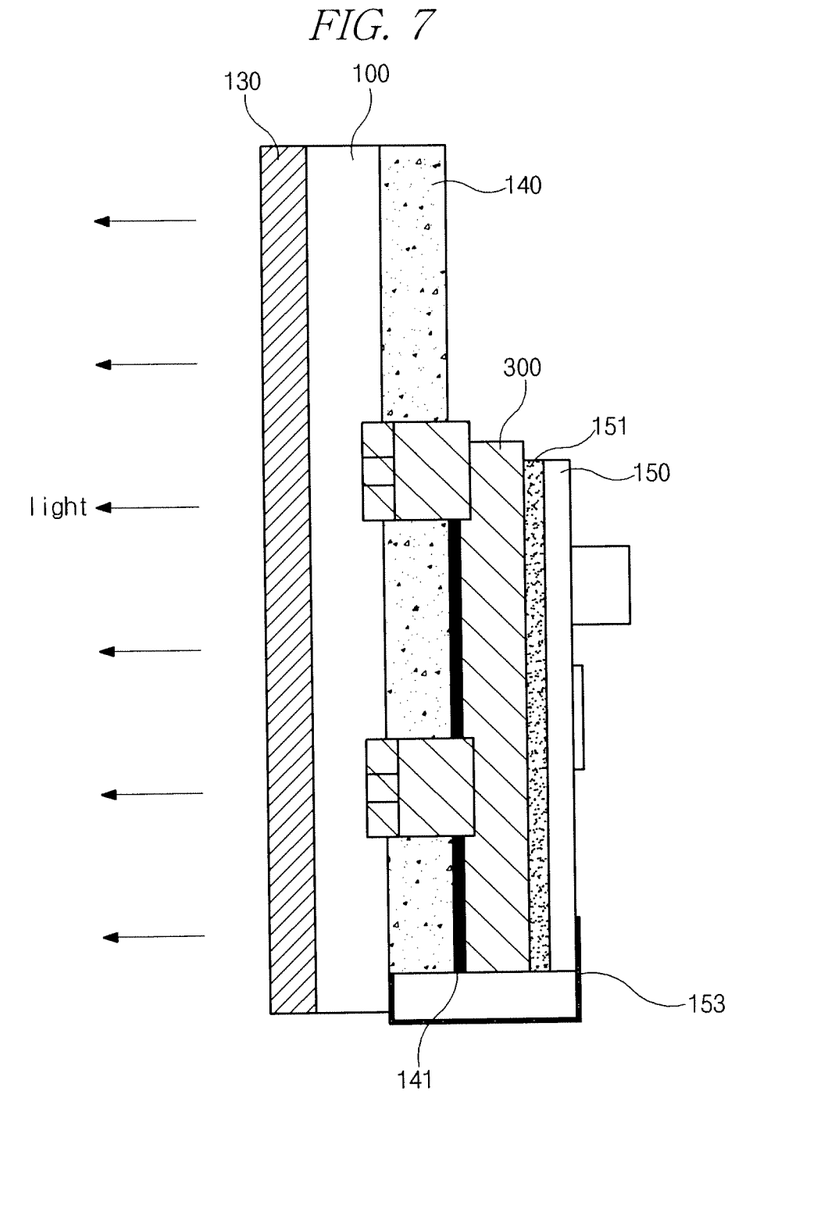
FIG. 7 is a cross-sectional view showing an organic electroluminescent display module according to an embodiment of the present invention.

FIG. 7 is a cross-sectional view showing an organic electroluminescent display module according to an embodiment of the present invention.

In FIG. 7, an organic electroluminescent display (ELD) module including an organic ELD panel 100, a polarizing plate 130, a radiating sheet 140, a bottom frame 300 and a printed circuit board (PCB) 150 is installed to an external case (not shown) and stands on a supporter (not shown) uprightly to emit light horizontally through a front surface. The PCB 150 having a plurality of driving circuits may be disposed to correspond to a lower portion of the organic ELD panel 100 so that the organic ELD module can balance weight. Similarly, the bottom frame 300 may be disposed to correspond to the PCB 150 and the lower portion of the organic ELD panel 100 for balancing weight.

In addition, the organic ELD module may be connected to the supporter by a hinge (not shown) such that the organic ELD module pivots from the supporter. The hinge may be disposed to correspond to the lower portion of the organic ELD panel 100 and the PCB 150 may be installed in the hinge. Further, the bottom frame 300 may be disposed to correspond to the hinge and the lower portion of the organic ELD panel 100.

Consequently, in an organic electroluminescent display module according to the present invention, since an organic electroluminescent display panel is modularized by a bottom frame of a metallic material, stiffness of the organic electroluminescent display module is improved. Accordingly, reliability and display quality of the organic electroluminescent display module are improved. In addition, since the bottom frame partially surrounds side and rear surfaces of the organic electroluminescent display panel, weight and thickness of the organic electroluminescent display module is further reduced.

It will be apparent to those skilled in the art that various modifications and variations can be made in the organic electroluminescent display module of the present invention without departing from the sprit or scope of the invention. Thus, it is intended that the present invention covers the modifications and variations of this invention provided they come within the scope of the appended claims and their equivalents.

What is claimed is:

1. An organic electroluminescent display module, comprising:
    an organic electroluminescent display panel including a front surface, a side surface and a rear surface, the front surface displaying images; and
    a bottom frame surrounding the side and rear surfaces partially, the bottom frame including a metallic material,
    wherein the organic electroluminescent display panel comprises:
    a first substrate including a switching thin film transistor, a driving thin film transistor and an organic electroluminescent diode thereon;
    a second substrate facing and spaced apart from the first substrate, the second substrate being a metal foil and attached to the first substrate; and
    a radiating sheet directly on and contacting an outer surface of the second substrate,
    wherein the bottom frame partially covers the outer surface of the second substrate.

2. The module according to claim 1, wherein the bottom frame comprises:
    a horizontal surface surrounding a portion of the rear surface; and a plurality of fixing portions perpendicularly bent from the horizontal surface and surrounding a portion of the side surface.

3. The module according to claim 2, wherein the plurality of fixing portions include at least two fixing portions at each of opposite side edges of the horizontal surface.

4. The module according to claim 3, wherein each of the plurality of fixing portions comprises:
   a first portion perpendicularly bent from the horizontal surface; and
   a second portion perpendicularly outwardly bent from the first portion.

5. The module according to claim 4, wherein the second portion includes a through hole for combining the bottom fame to an external case.

6. The module according to claim 1, further comprising:
   an insulating film on the bottom frame; and
   a printed circuit board on the insulating film, the printed circuit board including a plurality of driving circuit for driving the organic electroluminescent display panel.

7. The module according to claim 6, wherein the bottom frame is disposed to correspond to a lower portion of the organic electroluminescent display panel.

8. The module according to claim 6, wherein the printed circuit board is electrically connected to the organic electroluminescent display panel by a connecting means.

9. The module according to claim 8, wherein the connecting means includes a flexible printed circuit and a tape carrier package.

10. The module according to claim 6, wherein the insulating film and the printed circuit board are sequentially disposed under the rear surface of the organic electroluminescent display panel.

11. The module according to claim 1, wherein an outer surface of the first substrate emits light to display the images.

12. The module according to claim 1, further comprising a polarizing plate on an outer surface of the first substrate.

13. The module according to claim 1, wherein the radiating sheet includes one of a fan and a heat pipe.

14. The module according to claim 1, wherein the outer surface of the second substrate includes a first portion surrounded by the bottom frame and a second portion exposed outside the bottom frame.

15. The module according to claim 1, wherein the bottom frame is attached to the radiating sheet using an adhesive means.

16. The module according to claim 15, wherein the adhesive means includes a double-sided tape.

* * * * *